US005392259A

United States Patent [19]

Bolorforosh

[11] Patent Number: 5,392,259

[45] Date of Patent: Feb. 21, 1995

[54] MICRO-GROOVES FOR THE DESIGN OF WIDEBAND CLINICAL ULTRASONIC TRANSDUCERS

[76] Inventor: Mir S. S. Bolorforosh, 1704 Oak Creek Dr. #307, Palo Alto, Calif. 94309

[21] Appl. No.: 77,179

[22] Filed: Jun. 15, 1993

[51] Int. Cl.$^6$ .......................... H01L 41/02; H01L 41/08

[52] U.S. Cl. .......................... 367/152; 367/157; 310/334; 128/662.03

[58] Field of Search .......................... 310/334; 73/649; 367/162, 165, 152, 157, 176; 128/662.03

[56] References Cited

U.S. PATENT DOCUMENTS

| | | | |
|---|---|---|---|
| 2,716,708 | 8/1955 | Bradfield | 310/334 |
| 4,385,255 | 5/1983 | Yamaguchi et al. | 128/662.03 |
| 4,462,092 | 7/1984 | Kawabuchi et al. | 367/105 |
| 4,672,591 | 6/1987 | Breimesser et al. | 367/152 |
| 4,692,654 | 9/1987 | Umemura et al. | 310/334 |
| 5,030,874 | 7/1991 | Saito et al. | 310/334 |
| 5,115,809 | 5/1992 | Saitoh et al. | 128/662.03 |
| 5,115,810 | 5/1992 | Watanabe et al. | 128/662.03 |
| 5,142,187 | 8/1992 | Saito et al. | 310/334 |
| 5,175,709 | 12/1992 | Slayton et al. | 367/90 |

OTHER PUBLICATIONS

Wallace A. Smith, "Modeling 1-3 Composite Piezoelectrics: Thickness-Mode Oscillations," Jan. 1991, pp. 40-47.

R. E. Newnham et al., "Connectivity and Piezoelectric-Pyroelectric Composites," 1978, pp. 525-536.

M. I. Haller et al., "Micromachined acoustic matching layers," 1972, pp. 72-77.

M. I. Haller et al., "Micromachined Ultlrasonic Materials," 1991, pp. 403-405.

G. S. Kino, "Acoustic Waves," pp. 41-45.

*Primary Examiner*—Ian J. Lobo

[57] ABSTRACT

An ultrasonic probe including one or more piezoelectric ceramic elements mounted on an acoustically damping support body. Desired acoustic signals are transmitted and received through a front portion of the probe while unwanted acoustic signals are dampened by the support body at the rear portion of the probe. Each element has a respective rear face and a respective piezoelectric ceramic layer integral therewith to provide efficient acoustic coupling between the element and the acoustically damping support body. The respective piezoelectric layer of each element includes shallow grooves disposed on the respective rear face of each piezoelectric element. A groove volume fraction of the piezoelectric layer is selected to control acoustic impedance of the piezoelectric layer so as to provide a desired acoustic impedance match .between a bulk acoustic impedance of the element and an acoustic impedance of the acoustically damping support body. Electrodes extend into and contact the grooves, imposing electrical boundary requirements that support a desired electrical field distribution within the element.

16 Claims, 14 Drawing Sheets

MICRO-GROOVES FOR THE DESIGN OF WIDEBAND CLINICAL ULTRASONIC TRANSDUCERS

BACKGROUND OF THE INVENTION

The present invention generally relates to ultrasonic probes and more specifically to ultrasonic probes for acoustic imaging.

Ultrasonic probes provide a convenient and accurate way of gathering information about various structures of interest within a body being analyzed. In general, the various structures of interest have acoustic impedances that are different than an acoustic impedance of a medium of the body surrounding the structures. In operation, such ultrasonic probes generate a beam of broadband acoustic waves that is then coupled from the probe, though a lens, and into the medium of the body so that the acoustic beam is focussed by the lens and transmitted into the body. As the focussed acoustic beam propagates through the body, part of the signal is reflected by the various structures within the body and then received by the ultrasonic probe. By analyzing a relative temporal delay and intensity of the reflected acoustic waves received by the probe, a spaced relation of the various structures within the body and qualities related to the acoustic impedance of the structures can be extrapolated from the reflected signal.

For example, medical ultrasonic probes provide a convenient and accurate way for a physician to collect imaging data of various anatomical parts, such as heart tissue or fetal tissue structures within a body of a patient. In general, the heart or fetal tissues of interest have acoustic impedances that are different than an acoustic impedance of a fluid medium of the body surrounding the tissue structures. In operation, such a medical probe generates a beam of broadband acoustic waves that is then acoustically coupled from a front portion of the probe, through an acoustic lens, and into the medium of the patient's body, so that the beam is focussed and transmitted into the patient's body. Typically, this acoustic coupling is achieved by pressing the front portion of the probe having the lens mounted thereon into contact with a surface of the abdomen of the patient. Alternatively, more invasive means are used, such as inserting the front portion of the probe into the body through a catheter.

As the acoustic signal propagates through the patient's body, part of the acoustic beam is weakly reflected by the various tissue structures within the body and received by the front portion of the ultrasonic medical probe. By analyzing a relative temporal delay and intensity of the weakly reflected waves, an imaging system extrapolates an image from the weakly reflected waves. The extrapolated image illustrates spaced relation of the various tissue structures within the patient's body and qualities related to the acoustic impedance of the tissue structures. The physician views the extrapolated image on a display device coupled to the imaging system.

Since the acoustic signal is only weakly reflected by the tissue structures of interest, it is important to reduce any unwanted acoustic signals reflected by a rear portion of the probe. If part of the acoustic signal generated by the probe is reflected by the rear portion of probe and then transmitted into the patient's body, then a first unwanted acoustic signal is produced. Similarly, if a part of the weakly reflected signal received by the probe is transmitted though the probe and reflected by the rear portion of the probe, then another unwanted acoustic signal is produced. Such unwanted acoustic signals can distort the extrapolated image viewed by the physician unless corrective measures are undertaken. Though an acoustically damping support body can be coupled to the rear portion of the probe to help reduce problems caused by the extraneous acoustic signals, it is important to try to provide efficient acoustic coupling between the rear portion of probe and the support body.

A previously known acoustic coupling improvement scheme provides an ultrasonic probe comprising a layer of a dissimilar acoustic matching material adhesively bonded to a rear portion of a piezoelectric vibrator body. A thin layer of a cement adhesive is applied to bond each layer, thereby creating undesirable adhesive bond lines between the layers of dissimilar material and the piezoelectric body. The layer of matching material is in turn coupled to the acoustically damping support body. For example, FIG. 1 illustrates an ultrasonic transducer 100 comprising a piezoelectric vibrator body 104 of a piezoceramic, such as lead zirconate titanate having the acoustic impedance of $33*10^6$ kg/m$^2$s, a layer of dissimilar acoustic material such as silicon 106 having an acoustic impedance of $19.5*10^6$ kg/m$^2$s, a support body 108 of epoxy resin having an acoustic impedance of $3*10^6$ kilograms/meter$^2$second, kg/m$^2$s. The silicon layer is used to provide an improved acoustic impedance match between the relatively high acoustic impedance of the piezoceramic material of the vibrator body and the relatively low acoustic impedance of the support body. The vibrator body 104 shown in FIG. 1 has a resonant frequency of 20 megahertz, mhz, and the silicon layer has a thickness that is a quarter wave length of the resonant frequency of the vibrator body. Electrodes 110 are electrically coupled to the vibrator body 104 for electrically sensing acoustic signals received by the transducer.

The piezoelectric vibrator body 104 shown in FIG. 1 is connected on one side to the silicon layer by means of an adhesive layer 112. The thickness of the adhesive layer is typically 2 microns. A silicon layer adhesively bonded to a piezoelectric body is also discussed in U.S. Pat. No. 4,672,591 entitled "Ultrasonic Transducer" and issued to Briesmesser et al. Because this patent provides helpful background information concerning dissimilar acoustic matching materials bonded to piezoelectric bodies, it is incorporated herein by reference.

Though the dissimilar acoustic matching materials employed in previously known schemes help to provide impedance matching, the adhesive bonding of these layers creates numerous other problems. Bonding process steps needed to implement such schemes create manufacturing difficulties. For example, during manufacturing it is difficult to insure that no voids or air pockets are introduced to the adhesive to impair operation of the probe. Furthermore, reliability of this previously known transducers is adversely effected by differing thermal expansion coefficients of the layers of dissimilar materials and the piezoelectric ceramic bodies. Over time, for example over 5 years of use, some of the adhesive bonds may lose integrity, resulting in transducer elements that do not have efficient acoustic coupling to the damping support body. Additionally, operational performance is limited at higher acoustic signal frequencies, such as frequencies above 20 megahertz, by the bond lines between the piezoelectric body and the dissimilar materials.

One measure of such operational performance limitations is protracted ring down time in impulse response of the ultrasonic transducer of FIG. 1. Such impulse response can be simulated using a digital computer and the KLM model as discussed in "Acoustic Waves" by G. S. Kino on pages 41-45, which is incorporated herein by reference. FIG. 2 is a diagram of the simulated impulse response of the ultrasonic transducer of FIG. 1 having the resonant frequency of 20 Megahertz, radiating into water, and constructed in accordance with the principles taught by Briesmesser et al. In accordance with the impulse response diagram shown in FIG. 2, simulation predicts a −6 decibel, db, ring down time of 0.221 microseconds, usec, a −20 db ring down time of 0.589 usec, and a −40 db ring down time of 1.013 usec.

Another previously known ultrasonic probe includes high-polymer piezoelectric elements. Each of the high-polymer piezoelectric elements comprises a composite block of piezoelectric and polymer materials. For example, FIG. 3 is a cross sectional view of a typical piezoelectric composite transducer. As shown, a single piezoelectric ceramic plate is reticulately cut to be finely divided, so that a number of fine pole-like piezoelectric ceramics 301 are arranged two-dimensionally. A resin 307 including microballoons (hollow members) 306 is cast to fill in gaps between piezoelectric ceramic poles 301. The resin is cured so as to hold the piezoelectric ceramic poles 301. Electrodes 304, are provided on both end surfaces of the piezoelectric ceramic poles 301 and the resin 307, so as to form the piezoelectric ceramic transducer. The piezoelectric composite transducer shown in FIG. 3 is similar to one discussed in U.S. Pat. No. 5,142,187 entitled "Piezoelectric Composite Transducer For Use in Ultrasonic Probe" and issued to Saito et al. Because this patent provides helpful background Information concerning piezoelectric composites, it is incorporated herein by reference.

While composite materials provide some advantages, there are difficulties in electrically sensing reflected acoustic waves received by such composites. A dielectric constant of each high polymer element is relatively small. For example, for a composite that is 50% polymer and 50% piezoelectric ceramic, the dielectric constant measurable between electrodes of the high polymer element is approximately half of that which is inherent to the piezoelectric ceramic. Accordingly, the dielectric constant measurable between the electrodes of the high polymer element is only approximately 1700. A much higher dielectric constant is desirable so that a higher capacitive charging is sensed by the electrodes in response to the reflected acoustic waves. The higher dielectric constant would also provide an improved electrical impedance match between the probe and components of the imaging system electrically coupled to the probe.

What is needed is a reliable ultrasonic probe that provides enhanced operational performance and efficient electrical coupling to imaging system components.

SUMMARY OF THE INVENTION

An ultrasonic probe of the present invention provides efficient and controlled acoustic coupling of one or more piezoelectric ceramic elements to an acoustically damping support body and further provides efficient electrical coupling of the elements to electrodes for electrically exciting and sensing acoustic signals. Desired acoustic signals are transmitted and received by a front portion of the probe while unwanted acoustic signals are dampened by the support body at the rear portion of the probe. The present invention is not limited by manufacturing, reliability, and performance difficulties associated with previously known acoustic coupling improvement schemes that employ adhesive cements to bond layers of dissimilar acoustic materials to piezoelectric ceramics.

Briefly and in general terms, the ultrasonic probe of the present invention employs one or more piezoelectric ceramic elements, each having a respective bulk acoustic impedance. A respective pair of the electrodes is coupled to each element. Preferably, the piezoelectric elements are arranged in a one or two dimensional phased array. Each element has a respective rear face and a respective piezoelectric ceramic layer integral therewith for substantially providing a desired acoustic impedance match between the bulk acoustic impedance of the element and the acoustically dampening support body. For electrical potential measurable between the respective pair of electrodes, there is relatively little electrical potential difference along a respective thickness of the respective layer. Accordingly, the respective piezoelectric layer is substantially electromechanically inert. Each element further includes a respective bulk remainder portion that is electromechanically active and resonates at a desired bulk resonant frequency. By providing the acoustic impedance match, the inert piezoelectric layer helps to provide efficient and controlled acoustic coupling between the probe and the acoustically dampening support body.

The respective inert piezoelectric layer of each element includes shallow grooves disposed on the respective rear face of each piezoelectric element and extending through the thickness of the inert piezoelectric layer. More specifically, the shallow groves are micro-grooves, typically extending into the respective face of each element less than 1000 microns. In general, a depth dimension of the grooves is selected to be approximately a quarter a wavelength of the acoustic signals, A groove volume fraction of the inert piezoelectric layer is selected to control acoustic impedance and speed of sound of the inert piezoelectric layer so as to provide the desired acoustic impedance match.

The respective pair of electrodes electrically coupled to the piezoelectric ceramic material of each element includes a respective front electrode coupled to a respective front face of each element, and a respective rear electrode coupled to the respective rear face of each element. The rear electrode extends into and contacts the grooves, imposing electrical boundary requirements that support a desired electrical field distribution within the element. Design parameters such as the width and pitch dimensions of the grooves are adjusted as needed so that for electrical potential measurable between the respective electrode pairs of each array element, there is relatively little electrical potential difference along the thickness of the respective inert piezoelectric layer of each element. For example, the width and pitch dimensions of the grooves are selected so that there is a relatively small electrical potential difference along the thickness of the inert piezoelectric layer that is less than approximately %5 of the electrical potential measurable between the pair of electrodes. Because the electrical potential along the thickness of the inert piezoelectric layer is relatively small, the dielectric constant measurable between the electrodes of the element is relatively high and is substantially the same as that which is intrinsic to the ceramic material of the element.

As will be discussed in greater detail later herein, the relatively high dielectric constant is desired so that a high capacitive charging is sensed by the electrodes in response to reflected acoustic waves received by the piezoelectric elements of the probe of the present invention. The relatively high dielectric constant also provides for an improved electrical impedance match between the probe and components of an acoustic imaging system electrically coupled to the probe. Accordingly, the present invention is not burdened by difficulties associated with electrically sensing acoustic waves in previously known high polymer composites, which have a relatively low dielectric constant.

A manufacturing advantage associated with the present invention is that the grooves can be easily etched or cut into a wide ranges of piezoelectric materials. Furthermore, because the inert piezoelectric layer is integral with the piezoelectric element, the present invention provides impedance matching without being burdened by manufacturing and reliability problems that are associated with adhesively bonding layers of dissimilar layers to piezoelectric ceramics. High frequency performance of the ultrasonic probe constructed in accordance with the teachings of the present invention is not limited by finite thickness of adhesive bond lines present in some previously known ultrasonic probes.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. I shows a cut away cross sectional view of a previously known ultrasonic probe.

DETAILED DESCRIPTION OF PREFERRED EMBODIMENT

Figure 4:
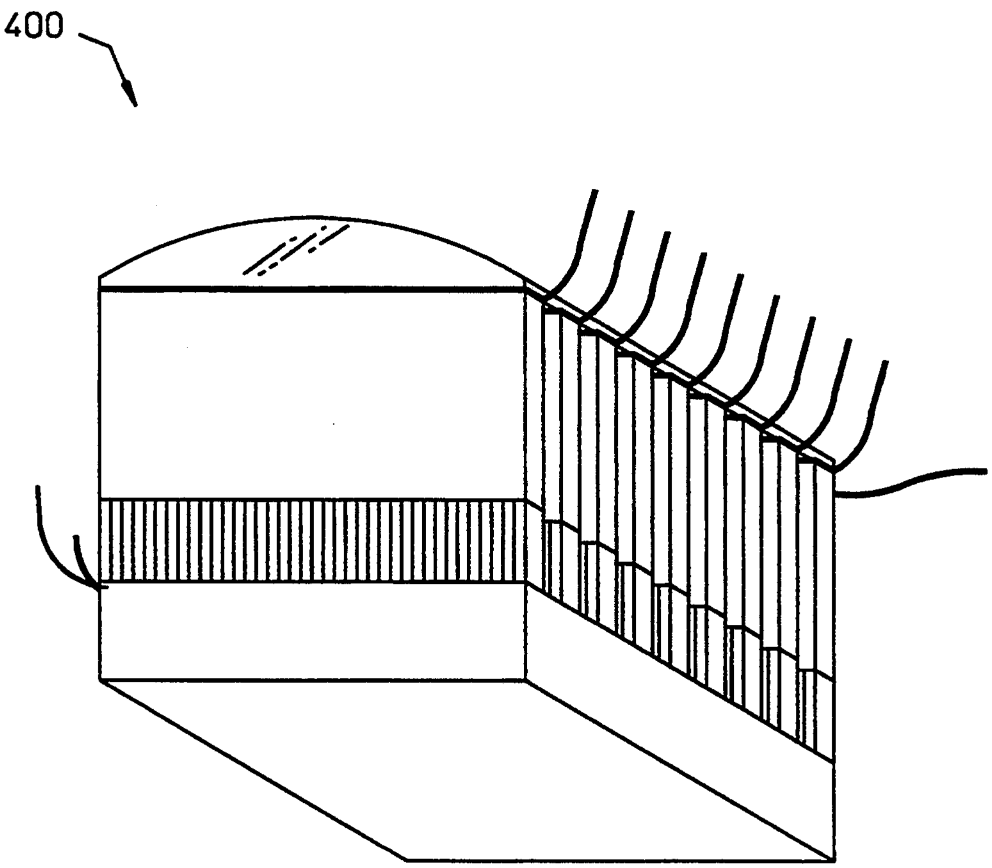
FIG. 4 shows a perspective view of an ultrasonic probe of a preferred embodiment of the present invention.
Figure 5:
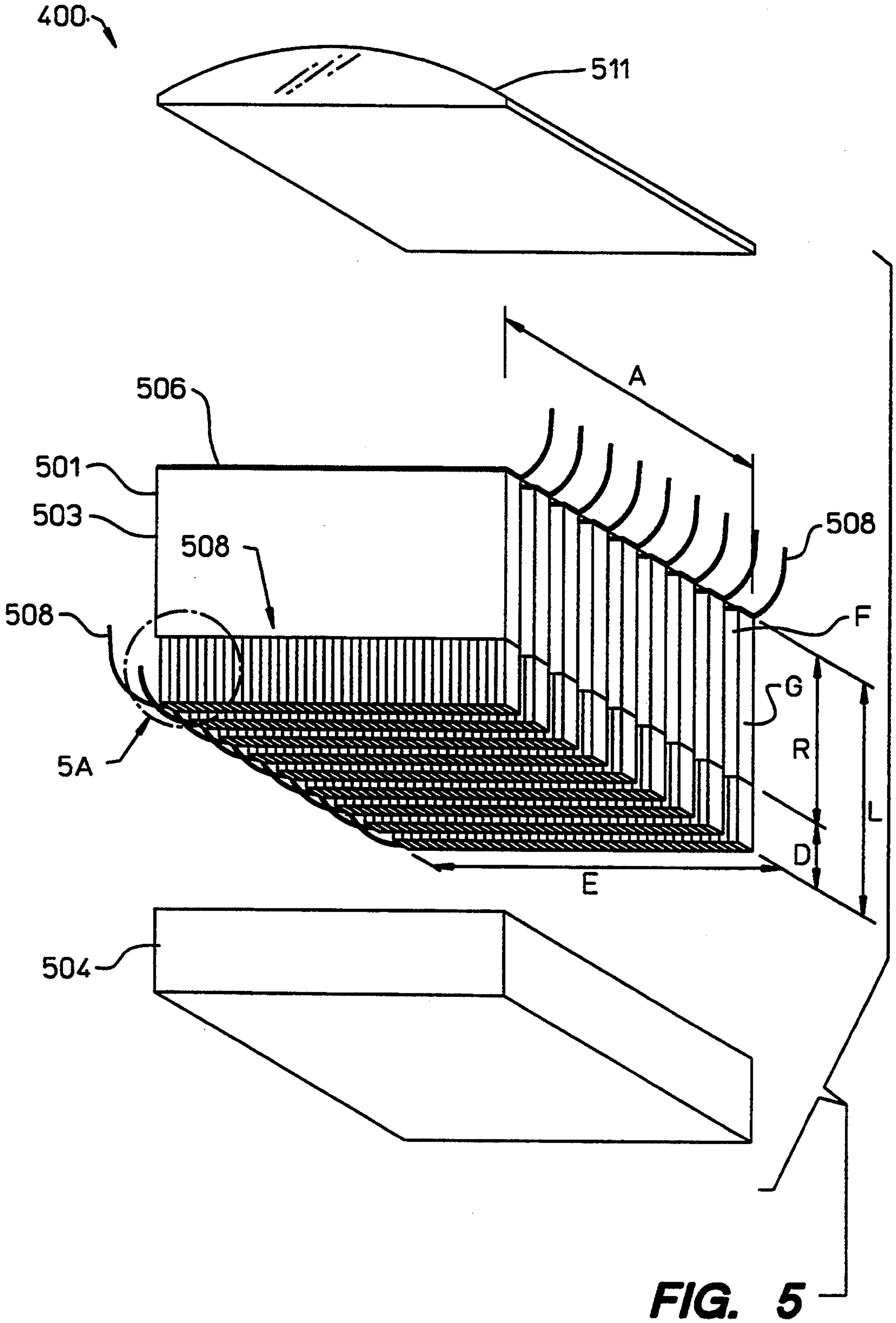
FIG. 5, shows an exploded view of the ultrasonic probe of FIG. 4.

The ultrasonic probe of the present invention provides efficient and controlled coupling of an acoustic signal between the probe and an acoustically damping support body, and further provides manufacturing, reliability and performance advantages. FIG. 4 is a simplified perspective view illustrating a preferred embodiment of the ultrasonic probe 400. FIG, 5 is an exploded view of the ultrasonic probe 400 shown in FIG. 4. As shown in FIG. 5, the preferred embodiment of the ultrasonic probe includes an array of piezoelectric ceramic elements 501, each having a bulk acoustic impedance $Z_{PZT}$ and each having a longitudinal dimension, L. Each element includes a respective piezoelectric ceramic layer 502 integral therewith and having a layer thickness defined by a depth dimension, D, of grooves extending through the layer. The respective piezoelectric layers are substantially electromechanically inert. Each piezoelectric element further includes a respective bulk remainder portion 503, which is electromechanically active and resonates at a desired bulk resonant frequency along a bulk remainder dimension, R, shown in FIG. 5. It is preferred that the bulk remainder dimension, R, be selected to be a half of a wavelength of the desired bulk resonant frequency.

Each array element has an elevational dimension, E, corresponding to a respective elevational aperture of each element. Elevational aperture and the resonant acoustic frequency of each element are selected based on a desired imaging application. Typically, the elevational dimension, E, is selected to be between 7 and 15 wave lengths of the resonant acoustic frequency of the probe. As shown, the piezoelectric elements are arranged in a suitable spaced apart relation, F, along an azimuthal dimension, A, on the acoustically damping support body 504. The support body is essentially made of epoxy, or other suitable acoustically damping material. As shown, each element has a suitably selected lateral dimension, G. Furthermore, a number of elements in the array is selected based on requirements of the imaging application. For example, an ultrasonic abdominal probe for a medical imaging application typically includes more than 100 elements and an elevational aperture of 10 wave lengths. For the sake of simplicity, far fewer elements are shown in the probe of FIG. 5.

In the preferred embodiment, the piezoelectric elements are essentially embodied in specially contoured blocks of a piezoelectric ceramic material, such as lead zirconate titanate, PZT, each having a respective front face and rear face oriented approximately parallel to one another and being oriented approximately perpendicular to the respective longitudinal dimension, L, of each element. It should be understood that although PZT is preferred, other piezoelectric ceramic materials known to those skilled in the art may be alternatively employed in accordance with the principles of the present invention, with beneficial results.

The respective inert piezoelectric layer 502 integral with the respective rear face of each piezoelectric element substantially provides an acoustic impedance match between the bulk acoustic impedance of each piezoelectric element and the acoustic impedance of acoustically damping support body. As shown in detailed view 5A, the respective inert piezoelectric layer 502 integral with each piezoelectric element 501 of the array includes the grooves 505, which are disposed on the respective rear face of each element to control acoustic impedance of the layer. In the preferred embodiment, the grooves are arranged substantially parallel to one another along the respective elevational dimension, E, of each element.

Figure 5A:
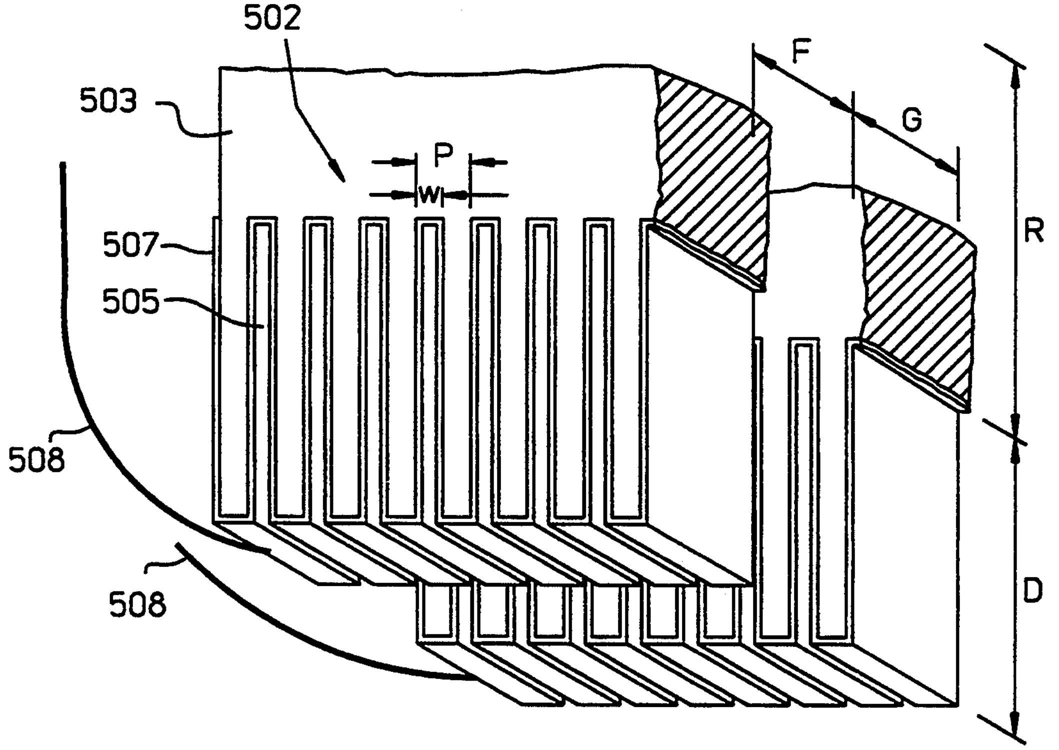
FIG. 5A shows a detailed cut away perspective view of FIG. 5.

As shown in FIGS. 5 and 5A, a respective pair of electrodes is electrically coupled to the piezoelectric ceramic material each piezoelectric element. The respective pair of electrodes of each element includes a respective front electrode 506 coupled to the respective front face of each piezoelectric element and further includes a respective rear electrode 507 extending into and contacting the grooves disposed on the respective rear face of each piezoelectric element. This arrangement of electrodes helps to insure that the piezoelectric layer is substantially electromechanically inert. A conformal material, preferably air, is disposed within the grooves adjacent to each electrode. As will be discussed in greater detail later herein, a suitable alternative conformal material, for example polyethylene, may be used instead of air. The selected conformal material has an acoustic impedance, $Z_{conformal}$, associated therewith.

By applying a respective voltage signal to the respective pair of electrodes coupled to each piezoelectric element, the bulk remainder portion of each element is excited to produce acoustic signals having the desired resonant frequency. Respective conductors 508 are coupled to each electrode for applying the voltage signals. The acoustic signals are supported in propagation along the respective longitudinal dimension of each element by a longitudinal resonance mode of the piezoelectric element. The respective acoustic signals produced by each piezoelectric element of the array are emitted together as a respective individual beam of acoustic waves. The individual beams of the elements of the array merge together into a single acoustic beam that is transmitted into the medium of the body under examination. For example, in a medical imaging application, the acoustic beam is transmitted into a patient's body. By controlling phasing of the respective voltage signals applied to each element of the array, phasing of the individual beams is controlled to effect azimuthal steering of the merged acoustic beam, so that the merged acoustic beam sweeps though the body. An acoustic lens 511, shown in exploded view in FIG. 5, is acoustically coupled to the elements to provide elevational focussing of the acoustic beam.

As the acoustic signals propagate through the patient's body, portions of the signal are weakly reflected by the various tissue structures within the body, are received by the piezoelectric elements, and are electrically sensed by the respective pair of electrodes coupled to each piezoelectric element. The reflected acoustic signals are first received by the respective bulk portion of each piezoelectric element. The signals then propagate along the respective longitudinal dimension of each piezoelectric element. The signals then propagate through the respective inert piezoelectric layer integral with each piezoelectric element. Accordingly, the acoustic signals propagate through the bulk remainder portion of the piezoelectric element with a first velocity, and then propagate through the inert piezoelectric layer with a second velocity. It is preferred that the depth dimension, D, of the grooves of the inert piezoelectric layer be selected to be a quarter of a wavelength of the acoustic signals traveling through the inert piezoelectric layer.

The depth dimension, D, of the grooves defines thickness of the respective inert piezoelectric layer integral with each of the piezoelectric elements. A depth dimension, D, of each groove and a pitch dimension, P, of the respective grooves are selected to separate lateral and shear resonance modes of the inert piezoelectric layer from undesired interaction with the longitudinal resonance mode of the piezoelectric element. Furthermore, the depth and pitch of the grooves are selected to provide efficient transfer of acoustic energy through the inert piezoelectric layer. Additionally, the depth and pitch of the grooves are selected so that the inert piezoelectric layer appears homogenous to acoustic waves. In general, beneficial results are produced by a pitch to depth, P/D, of less than or equal to approximately 0.4, in accordance with additional groove teachings of the present invention discussed in greater detail later herein. The width and pitch dimensions of the grooves are further adjusted, if needed so that for an electrical potential measurable between the respective pair of electrodes of each array element, there is a relatively small electrical potential difference along the thickness of the inert piezoelectric layer. For example, the width and pitch dimensions of the grooves are selected so that there is an electrical potential difference along the thickness of the piezoelectric layer that is less than approximately %5 of the electrical potential measurable between the respective pair of electrodes of each element.

Acoustic impedance of the inert piezoelectric layer is controlled so as to provide an acoustic impedance match between the bulk acoustic impedance of each piezoelectric element and an acoustic impedance of the acoustically damping support body. The acoustic impedance of the inert piezoelectric layer is substantially determined by groove volume fraction, which is based upon the width and pitch dimensions of the grooves 505 disposed on the respective rear face of each of the piezoelectric elements 501.

A desired acoustic Impedance of the inert piezoelectric layer, $Z_{layer}$, is calculated to produce an impedance match between the bulk acoustic impedance of the ceramic material of the piezoelectric element, $Z_{PZT}$, and the acoustic impedance of the acoustically damping support body, $Z_{body}$, using an equation:

$$Z_{layer}=(Z_{PZT}*Z_{body})^{\frac{1}{2}}$$

For example, given that the acoustic impedance of the acoustically damping support body, $Z_{body}$, is $3*10^6$ kilograms/meter$^2$second, kg/m$^2$s, and that the bulk acoustic impedance of lead zirconate titanate, $Z_{PZT}$, is $33*10^6$ kg/m$^2$s, the desired acoustic impedance of the inert piezoelectric layer, $Z_{layer}$, is calculated to be approximately $9.95*10^6$ kg/m$^2$s.

The acoustic impedance of the inert piezoelectric layer is substantially controlled by the groove volume fraction of the inert piezoelectric layer. The groove volume fraction of the layer is defined by dividing a volume of a groove extending through the layer by a sum of the volume of the groove and a volume of remaining layer ceramic adjacent to the groove. A desired groove volume fraction, v, is calculated from the desired acoustic impedance of the layer and respective acoustic impedances of the piezoelectric ceramic material, and the conformal material. The desired volume fraction, v, is approximately equal to an expression:

$$(Z_{PZT}-Z_{layer})/(Z_{PZT}-Z_{conformal})$$

For example, given air as the conformal material having an acoustic impedance, $Z_{conformal}$, of 411 kg/m$^2$s, and given values for the acoustic impedance of the inert piezoelectric layer, $Z_{layer}$, and the bulk acoustic impedance of the ceramic material of the element, $Z_{PZT}$, as articulated previously herein, the desired groove volume fraction of the inert piezoelectric layer, v, is approximately 69.8%.

A desired depth of the grooves. D, is calculated from a speed of sound in the inert piezoelectric layer, $C_{layer}$, and a quarter wavelength of the resonant acoustic frequency, f, of the piezoelectric element, using an equation:

$$D=\frac{1}{4}(C_{layer}/f)$$

Given that the desired groove volume fraction of the inert piezoelectric layer is approximately 69.8%, speed of sound in the inert piezoelectric layer, $C_{layer}$, can be estimated as being approximately $3.5*10^5$ centimeters/second. Alternatively the speed of sound in the inert piezoelectric layer can be estimated using more sophisticated methods, such as those based on tensor analysis models of the inert piezoelectric layer. For instance, tensor analysis models discussed in "Modeling 1-3 Composite Piezoelectrics: Thickness-Mode Oscillations", by Smith et. al, pages 40-47 of IEEE Transactions on Ultrasonics, Ferroelectrics, and Frequency Control, Vol. 38, No 1, January 1991, can be adapted to estimate speed of sound in the inert piezoelectric layer. Given speed of sound in the inert piezoelectric layer, $C_{layer}$, estimated as $3.5*10^5$ centimeters/second and the desired bulk resonant frequency, f, as 2 Mhz, the depth of the grooves, D, is approximately 437.5 microns. Accordingly, the grooves are shown to be micro-grooves, extending into the rear face of the element less than 1000 microns.

A pitch, P, of the grooves is calculated so that the pitch is less than 0.4 of the depth of the grooves:

$$P \leq (0.4*D)$$

For example, given depth of the grooves, D, of approximately 437.5 microns, pitch of the grooves should be less than or equal to 175 microns.

Width of grooves, W, is calculated based upon the pitch, P, the groove volume fraction, v, and a correction factor, k, using an equation:

$$W=P*v*k$$

A desired value for the correction factor, k, is selected based on connectivity of the ceramic of the inert piezoelectric layer and the conformal material. For the inert piezoelectric layer having grooves arranged as shown in FIGS. 5 and 5A, the layer has 2—2 connectivity with the conformal material and the correction factor, k, is simply 1. In alternative embodiments, the grooves are alternately arranged so that the layer has a different connectivity, yielding a different correction factor. For instance, in an alternative embodiment, the grooves are arranges so that the layer has a 1-3 connectivity, yielding a correction factor, k, of 1.25. Given 2—2 connectivity so that the correction factor, k, is 1, pitch of 175 microns, and groove volume fraction of the inert piezoelectric layer of 69.8%, the width, W, of the grooves is approximately 122.1 microns.

For embodiments of the probe scaled to operate at a higher resonant frequency, relevant groove dimensions are scaled accordingly. For example, for an embodiment of the probe scaled to operate at a resonant acoustic frequency of 20 mhz, relevant groove dimensions of the 2 mhz probe example discussed previously are scaled by a factor of 10. Therefore, for an array of piezoelectric elements each having a bulk resonant frequency of 20 mhz and respective piezoelectric layers with grooves arranged for 2—2 connectivity, relevant dimensions of the grooves are scaled down by 10 so as to have pitch of 17.5 microns, width of 12.21 microns, and depth of approximately 43.75 microns. Accordingly, the grooves are once again shown to be micro-grooves, extending into the rear face of the element less than 1000 microns.

A respective number of members in a set of grooves along the elevational dimension, E, of each piezoelectric element of the array is related to the pitch of the grooves and the respective elevational aperture of each element. Typically, the respective number of members in the set of grooves along the elevational dimension, E, is approximately between the range of 50 and 200 grooves to produce beneficial impedance matching results. As an example, for a given preferred elevational dimension, E, of 10 wave lengths, a preferred respective number of grooves along the elevational dimension is approximately 100 grooves. For the sake of simplicity, fewer grooves than 100 grooves are shown in FIG. 5.

Rear metal electrodes extend into and contact the grooves, imposing electrical boundary requirements that support a desired electrical field distribution within each element. Design parameters such as the width and pitch dimensions of the grooves are adjusted as needed so that for an electrical potential difference measurable between the respective electrode pairs of each array element, there is a relatively small potential difference along the thickness of the respective piezoelectric layer of each element. For example, the width and pitch dimensions of the grooves are selected so that there is a relatively small potential difference along the thickness of the piezoelectric layer that is less than approximately %5 of the electrical potential difference measurable between the respective pair of electrodes. It should be understood that for ultrasonic probes, there are several relevant sources of the electrical potential difference measurable between the respective pair of electrodes. For example, one relevant source of the electrical potential difference measurable between the respective pair of electrodes is voltage applied to the electrodes to excite acoustic signals in each piezoelectric ceramic element. Another relevant source of the electrical potential difference measurable between the respective pair of electrodes is voltage induced in each piezoelectric element by weakly reflected acoustic signals received by each element.

Figure 6:
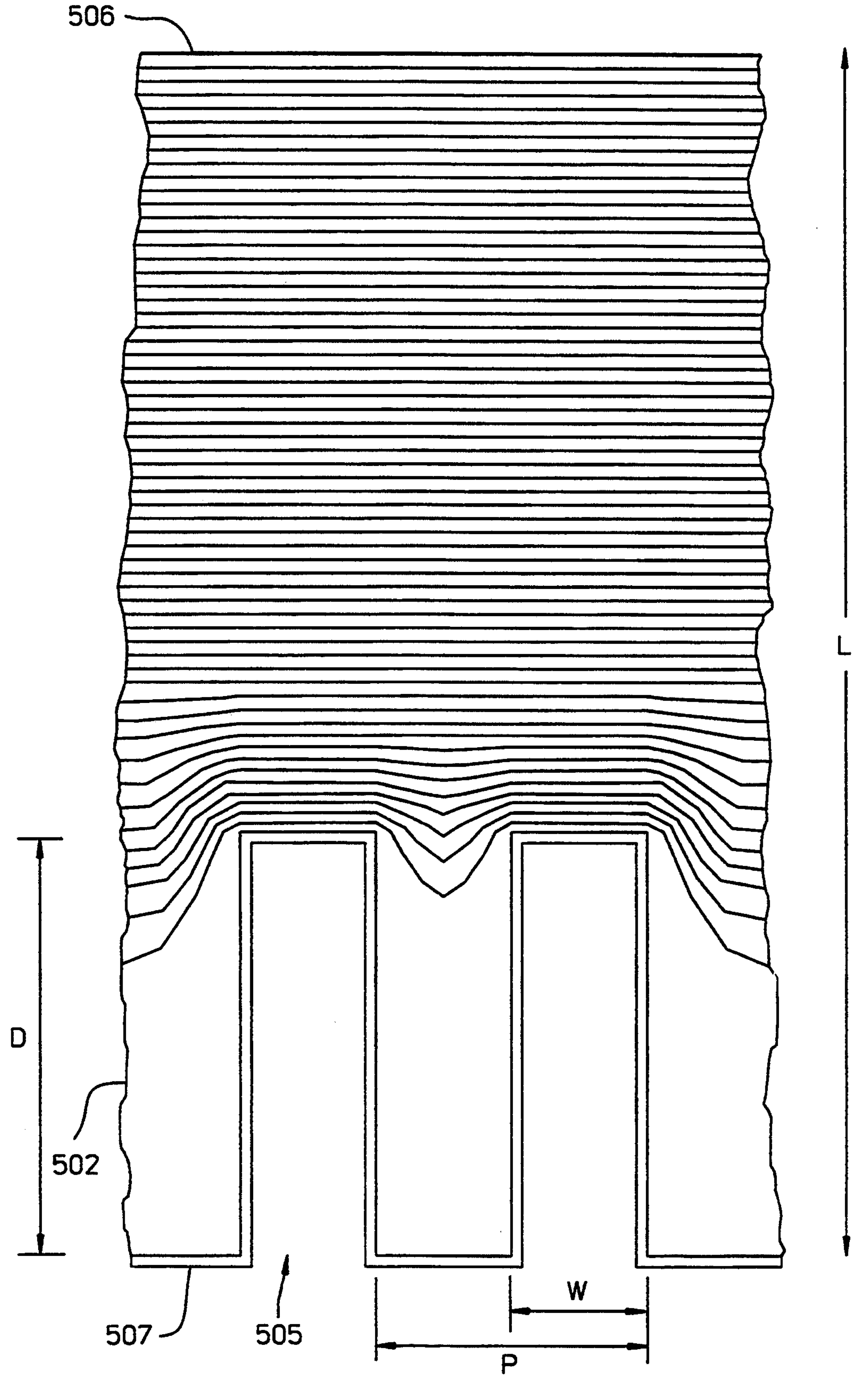
FIG. 6 is a diagram illustrating lines of electric equipotential distributed along a longitudinal dimension of a piezoelectric element of the probe of FIG. 5.

The relatively small electrical potential difference along the thickness of the piezoelectric layer is graphically illustrated in FIG. 6. FIG. 6 is a detailed cut away sectional view of one of the piezoelectric elements of FIG. 5, providing an illustrative diagram showing lines of electrical equipotential distributed along the longitudinal dimension, L, of the element for the example of width and depth of grooves discussed previously herein. Although lines of electrical equipotential are invisible, representative lines are drawn into the diagram of FIG. 6 for illustrative purposes. As shown in cross section, grooves having pitch, P, width, W, and depth, D, extend into the rear face of the element, through the thickness of the piezoelectric layer 502. Given an exemplary 1 volt potential measurable between the pair of electrodes 506, 507, the lines of equipotential shown in FIG. 6 correspond to 0.01 Volt increments in potential. Since electrical boundary requirements provide that there is substantially no tangential component of any electrical field at a conductor boundary, and since electric field distributions change gradually, the rear metal electrodes extend into and contact the grooves to impose electrical boundary requirements that support the desired electrical field distribution within the element. As shown in FIG. 6, there is a relatively small electrical potential difference along the thickness of the inert piezoelectric layer that is only approximately %3 of the electrical potential measurable the pair of electrodes of the array element. Because the electrical potential difference along the thickness of the inert piezoelectric layer is relatively small as shown in FIG. 6, the dielectric constant measurable between the electrodes 506, 507 of the element is substantially the same as that which is intrinsic to the lead zirconate titanate material of the element, and therefore is relatively high. Furthermore, the relatively small potential difference along the thickness of the piezoelectric layer further helps to insure that the piezoelectric layer is substantially electromechanically inert.

Upon the element receiving weakly reflected acoustic signals as discussed previously herein, capacitive charging of the electrodes is driven by a displacement current. The displacement current is linearly proportional to a product of an electric potential measurable between the respective pair of electrodes and the dielectric constant. Accordingly: the relatively high dielectric constant provides a relatively high capacitive charging. The high capacitive charging is desired to efficiently drive cabling that electrically couples the electrodes to imaging system components, which analyze a relative temporal delay and intensity of the weakly reflected acoustic signal received by the probe and electrically sensed by the electrodes. From the analysis, the imaging system extrapolates a spaced relation of the various structures within the body and qualities related to the acoustic impedance of the structures to produce an image of structures within the body.

Similarly, electrical impedance of each element is inversely proportional to the dielectric constant of each element. The relatively high dielectric constant provides a relatively low electrical impedance. The low electrical impedance of each element is desired to provide an improved impedance match to a low electrical impedance of the cabling and to a low electrical impedance of imaging system components.

Figure 7A:
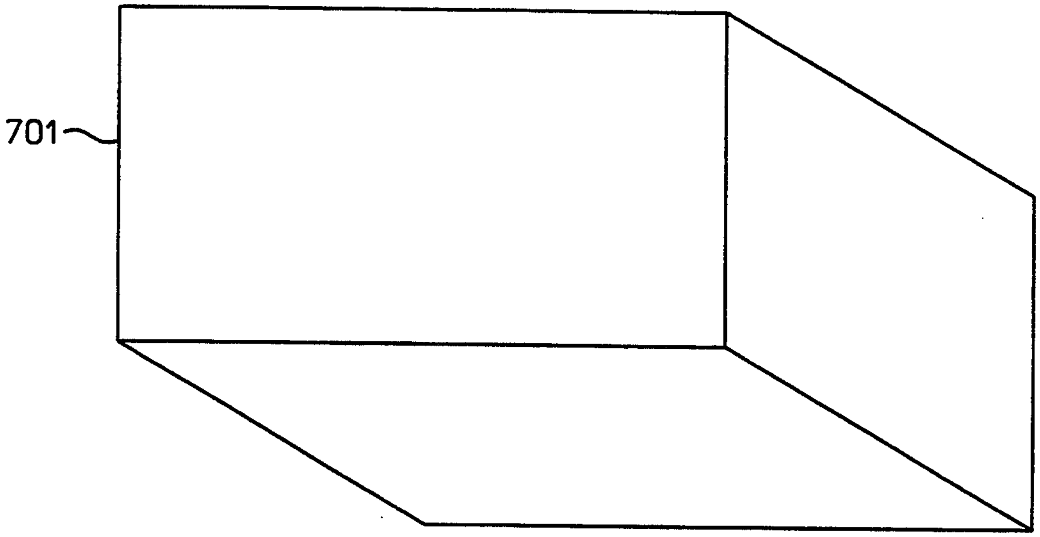
FIGS. 7A–D are perspective views illustrating steps in making the probe of FIG. 5.
Figure 7B:
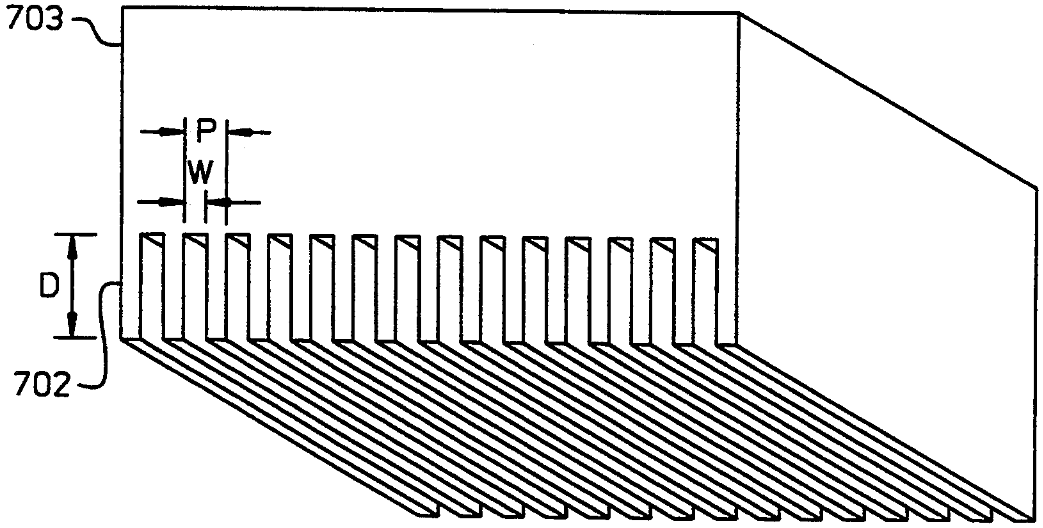

Fabrication, poling, and dicing of the piezoelectric elements of the army are illustrated and discussed with reference to simplified FIGS. 7A–D. An initial step is providing a slab 701 of raw piezoelectric ceramic material as shown in FIG. 7A. Since the raw material has not yet been poled, there is only random alignment of individual ferroelectric domains within the material and therefore the material is electromechanically inert. As shown in FIG. 7B, the slab includes an inert piezoelectric layer 702 integral with the slab and a bulk remainder portion 703 of the slab. The inert piezoelectric layer is characterized by grooves having a depth, D, cut into a rear face of the slab and extending through a thickness of the layer. The grooves are cut into the slab using a blade of a dicing machine. Width of the blade is selected so that the grooves have the desired width dimension, W. Controls of the dicing machine are set to cut the grooves at the desired pitch, P, and depth, D. Alternatively, photolithographic processes utilizing chemical etching may be employed to etch the grooves into the rear surface of the slab at the desired pitch, depth, and width. As another alternative, the grooves can be ablated onto the rear face of the slab using a suitable laser.

Figure 7C:
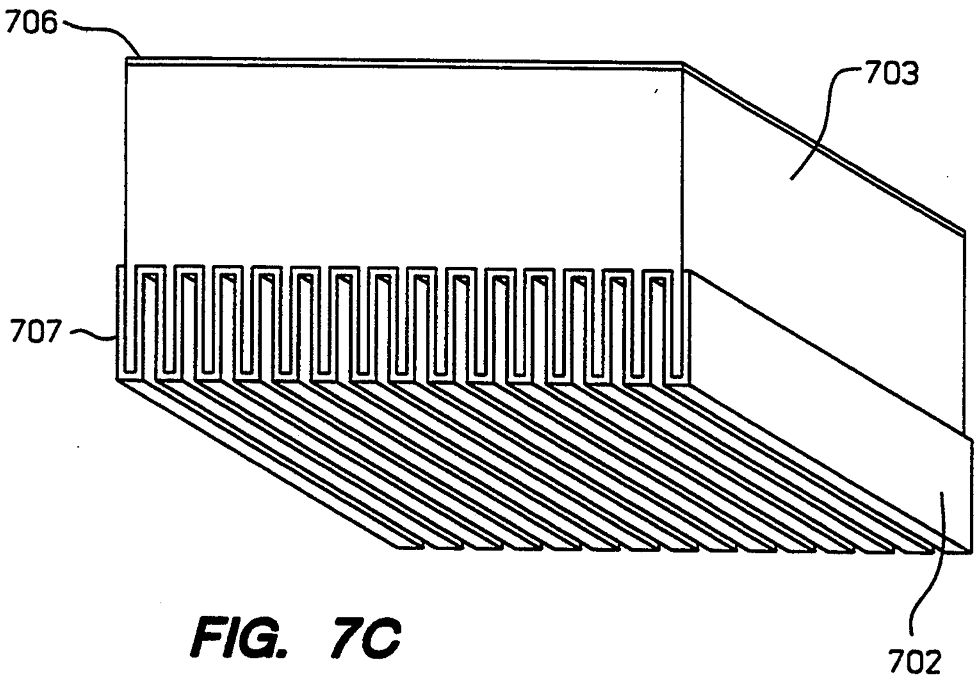

Metal electrodes are deposited onto the slab by sputtering. A thin metal film having a selected thickness between approximately 1000 to 3000 angstroms is sputtered onto the front face to produce a front electrode 706, and another similar thin metal film is sputtered onto the rear face to produce a rear electrode 707, as shown in FIG. 7C. The metal film of the rear electrode 707 extends into and contacts the grooves in the rear face of the slab.

A poling process comprises placing the slab into a suitable oven, elevating a temperature of the slab close to a curie point of the raw piezoelectric ceramic material, and then applying a very strong direct current, DC, electric field of approximately 20 kilovolts/centimeter across the front and rear electrodes while slowly decreasing the temperature of the slab. Because an electrical potential difference along the thickness of the inert piezoelectric layer including the grooves is only a small fraction of a total electrical potential between the electrodes, the inert piezoelectric layer 702 substantially retains the random alignment of individual ferroelectric domains present in the raw piezoelectric material. Accordingly, the inert piezoelectric layer 702 is only very weakly poled and remains electromechanically inert. The weak poling of the piezoelectric layer further helps to insure that the layer is electromechanically inert. In contrast, the poling process aligns a great majority of individual ferroelectric domains in the bulk remainder portion 703 of the piezoelectric slab. Accordingly, the bulk remainder portion 703 of the slab is very strongly poled and is electromechanically active.

Figure 7D:
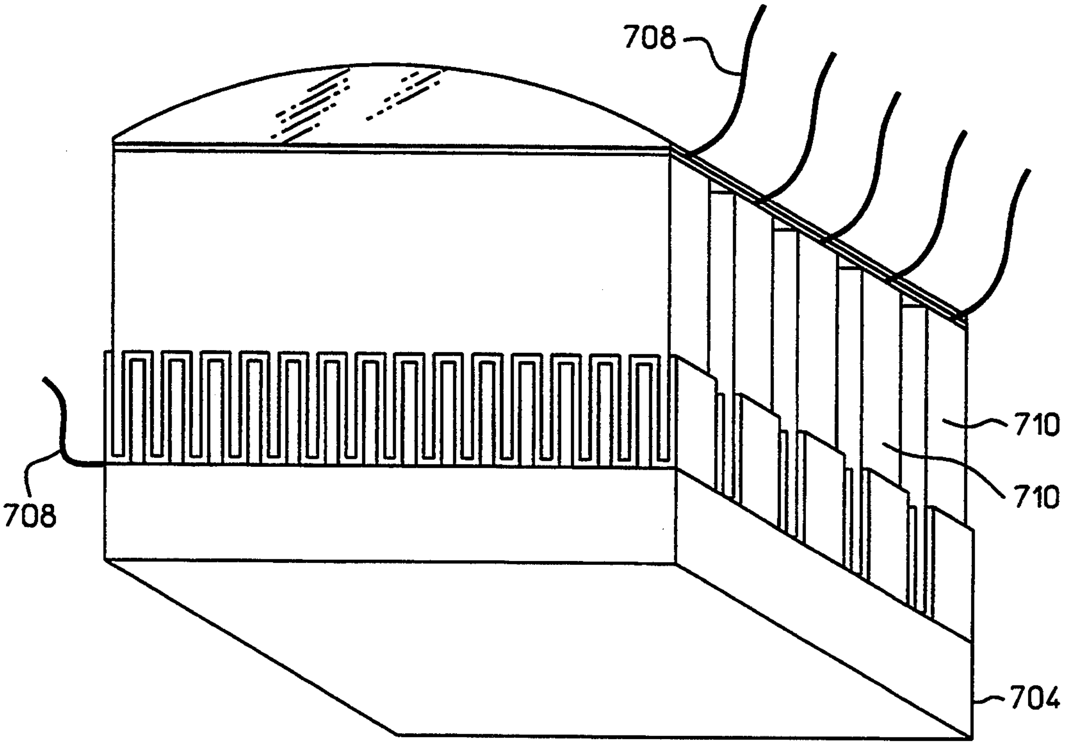

Conformal material is disposed in the grooves. As discussed previously herein, in the preferred embodiment the conformal material is a gas, such as air. In another preferred embodiment, the conformal material is a low density conformal solid, such as polyethylene. Conducting leads 708 are electrically coupled to the metal films, as shown in FIG. 7D, using a wire bonding technique. Alternatively, the conducting leads may be electrically coupled to the metal films by a very thin layer of epoxy or by soldering. An acoustically damping support body 704 made from an epoxy based backing material is cast on the rear face of the slab to support the slab, as shown in FIG. 7D. The dicing machine cuts entirely through the piezoelectric slab at regularly spaced locations to separate distinct piezoelectric elements of the array 710. An acoustic lens shown in exploded view in FIG. 7D is cast from a suitable resin on the front face of the piezoelectric elements.

The inert piezoelectric layer that provides acoustic impedance matching in accordance with the principles of the present invention also provides enhanced operational performance at high acoustic frequencies because the layer is integral with the piezoelectric element. In previously known ultrasonic transducers, a dissimilar impedance matching layer was made separate from the piezoelectric element and then bonded to the transducers using a typical 2 micron layer of adhesive cement, resulting in performance limitations as discussed previously herein. One measure of the enhanced operational performance is reduced ring down time in impulse response of the piezoelectric elements of the probe. Such impulse response can be simulated using a digital computer and the KLM model as discussed previously herein.

Figure 1:
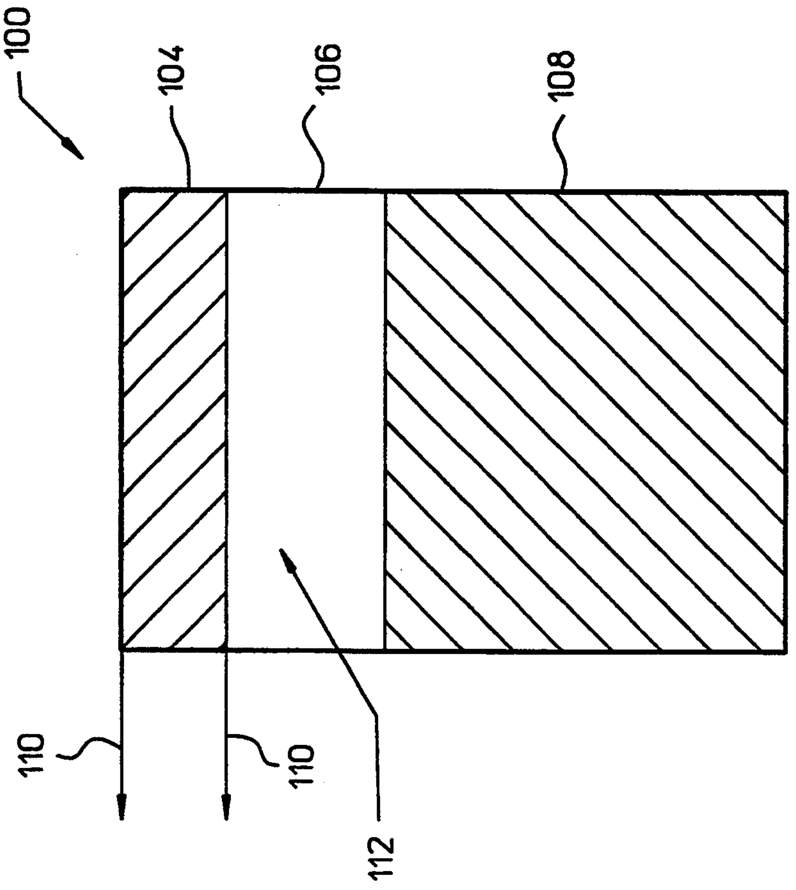
FIG. 1 (PRIOR ART)
Figure 2:
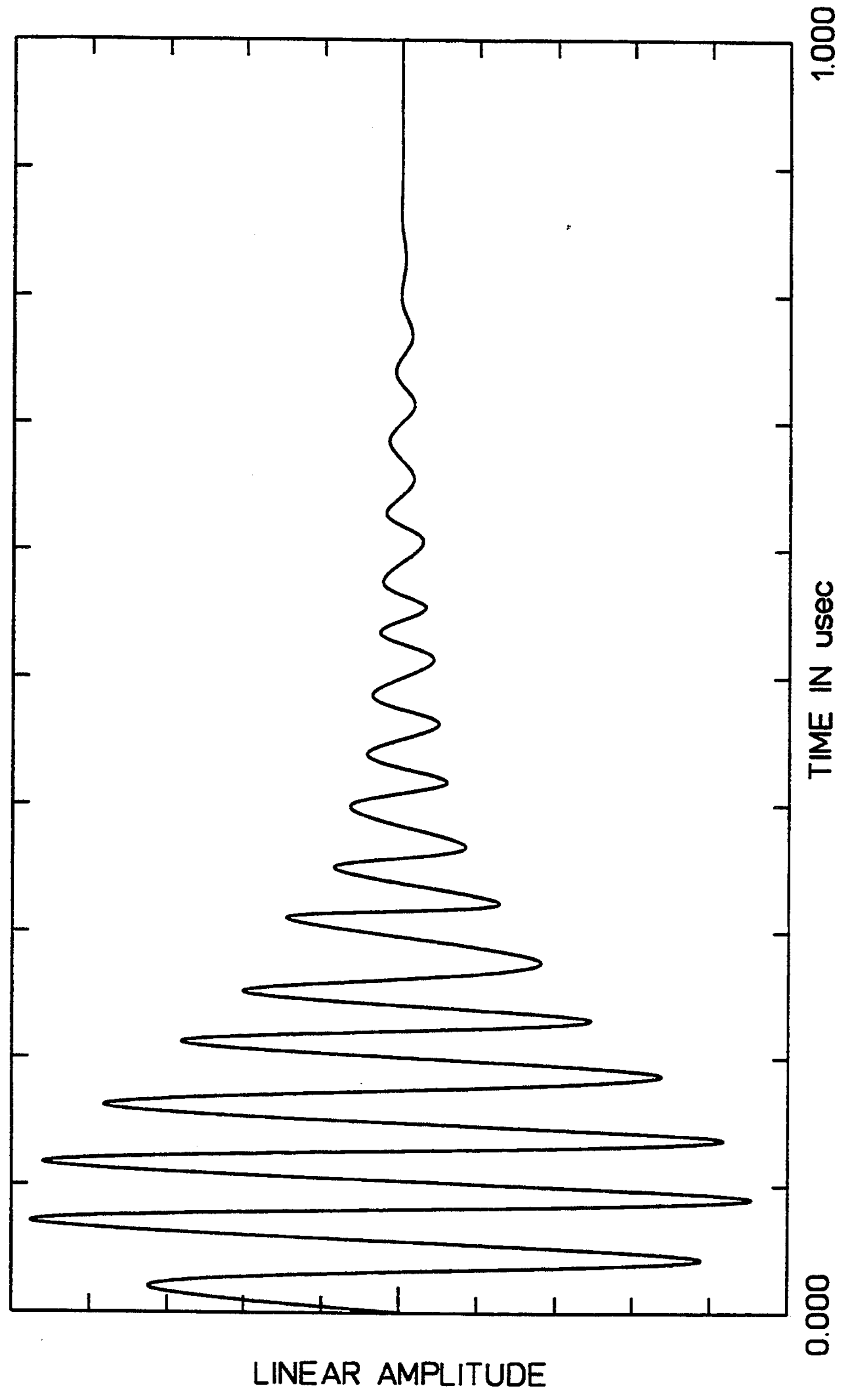
FIG. 2 (PRIOR ART)
FIG. 2 is a diagram illustrating a simulated impulse response of the transducer of FIG. 1.
Figure 3:
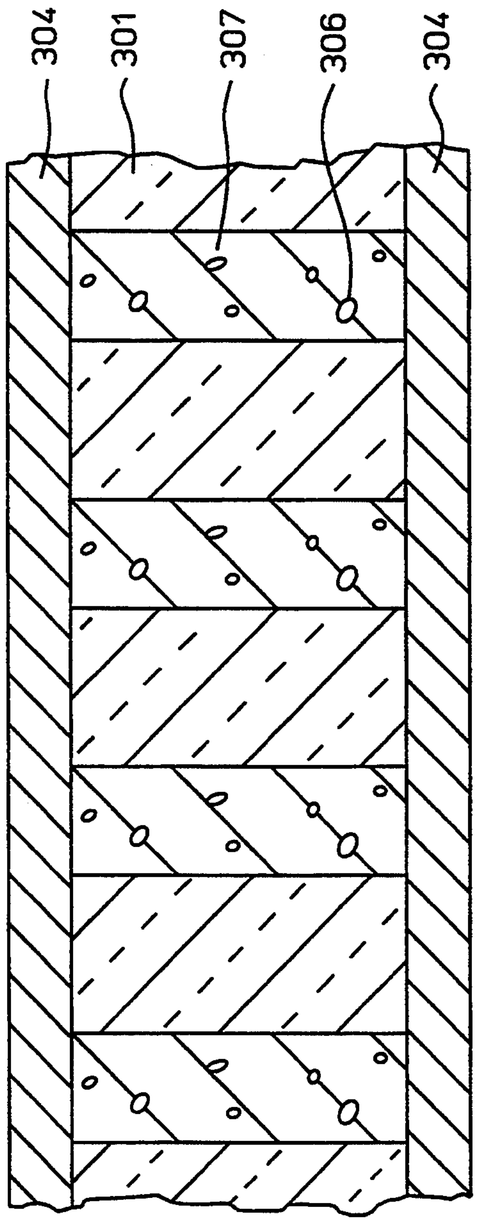
FIG. 3 (PRIOR ART)
FIG. 3 shows a cut away cross sectional view of another previously known ultrasonic transducer.
Figure 8:
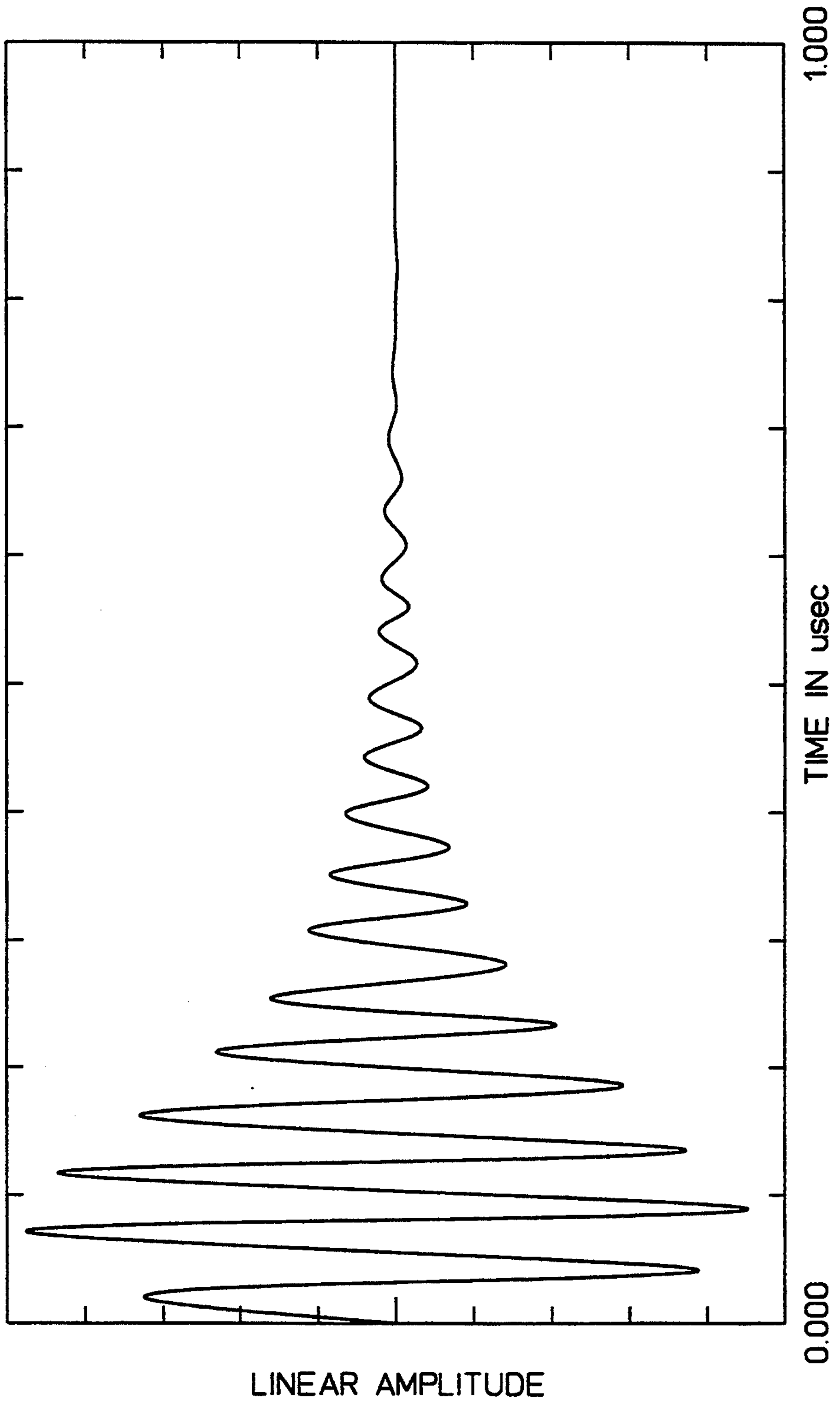
FIG. 8 is a diagram illustrating a simulated impulse response of a probe similar to that shown in FIG. 5.

FIG. 8 is a diagram of a simulated impulse response of the piezoelectric element similar to that shown in FIG. 5, but having a resonant frequency of 20 Megahertz, and radiating into water. In accordance with the impulse response diagram shown in FIG. 8, simulation predicts a reduced −6 decibel, db, ring down time of 0.201 microseconds, usec, a reduced −20 db ring down time of 0.383 usec, and a reduced −40 db ring down time of 0.734 usec. In contrast, the impulse response of the previously known transducer shown in FIG. 2 and discussed previously herein shows the protracted ring down time.

By selecting arrangement and dimensions of the grooves disposed on the surface of the piezoelectric element, desired acoustic properties of the piezoelectric ceramic layer are tailored to satisfy various acoustic frequency response requirements. In some alternative embodiments, the grooves include a plurality of sets of grooves in each piezoelectric element, for providing the piezoelectric elements with enhanced acoustic impulse frequency response. Each set of grooves includes members having a respective groove depth related to a respective wavelength of the acoustic signals. Such alternative embodiments are made in a similar manner as discussed previously with respect to FIGS. 7A–D.

Figure 9:
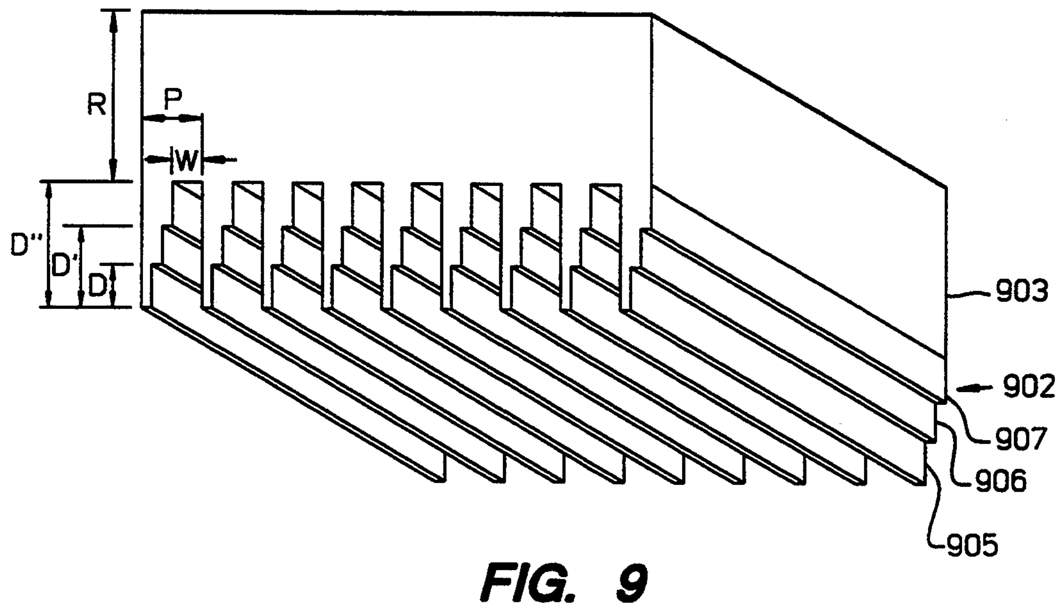
FIG. 9 illustrates an alternative embodiment of grooves extending through the piezoelectric layer of the present invention.

For example, a first alternative embodiment of the inert piezoelectric layer of the present invention is illustrated in FIG. 9. As in FIG. 7B discussed previously, FIG. 9 shows a slab of piezoelectric material having a inert piezoelectric layer 902 integral with the slab, grooves extending through the layer, and a bulk remainder portion 903 of the slab. In contrast to FIG. 7B discussed previously, the grooves of FIG. 9 include a first set of grooves 905, a second set of grooves 906, and third set of grooves 907 arranged adjacent one another. As shown, the grooves are cut into the slab so that the grooves have a pitch, P, and a width, W. Each member of the first set of grooves is cut into the rear face of the piezoelectric element at a respective depth, D, which is approximately equal to an integral multiple of one quarter of a first wavelength of the acoustic signals. Similarly, each member of the second set of grooves has a respective depth dimension, D′, which is approximately equal to an integral multiple of one quarter of a second wavelength of the acoustic signals. Each member of a third set of grooves has a respective depth dimension, D″, which is approximately equal to an integral multiple of one quarter of a third wavelength of the acoustic signals. Respective members of the first, second and third set of grooves are arranged in a "stair step" pattern as shown in FIG. 9. A single conformal material can be deposited in each set of grooves. Alternatively, a different conformal material can be deposited in each set of grooves to achieve the desired frequency response. Sputtering, poling and dicing processes are then performed in a similar manner as discussed previously with respect to FIGS. 7C and 7D in order to complete the alternative embodiment of the ultrasonic probe having enhanced frequency response.

Figure 10:
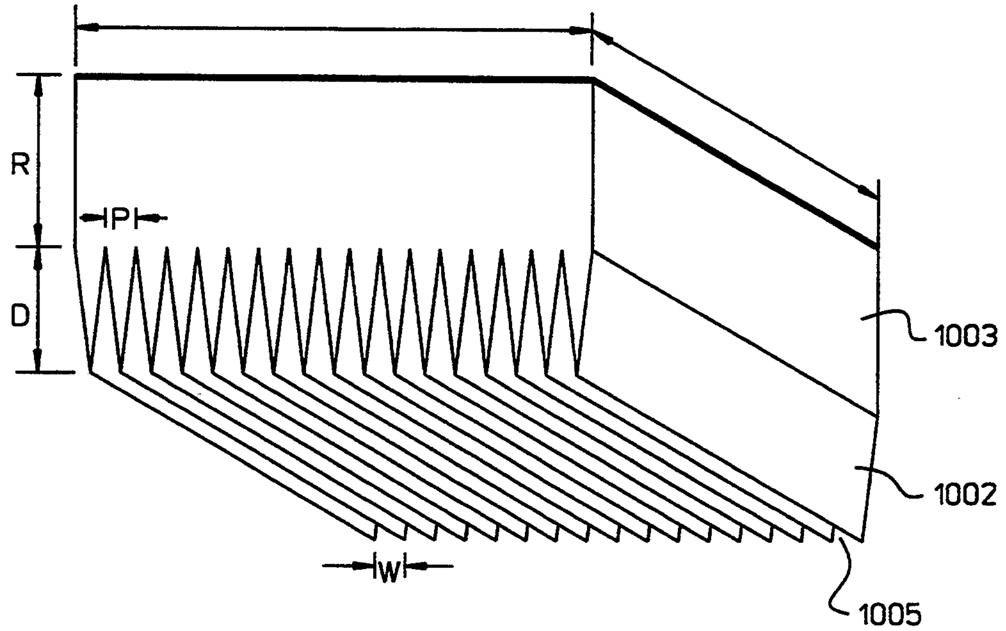
FIG. 10 illustrates another alternative embodiment of grooves extending through the piezoelectric layer of the present invention.

In other alternative embodiments, a smoothed groove profile is etched, in place of the abrupt "stair step" pattern, to provide the piezoelectric elements with enhanced acoustic performance such as broad frequency response or improved acoustic sensitivity, depending on design requirements. For example, such alternative embodiments include grooves each having a smoothed "V" profile and extending into the rear surface of the piezoelectric element. Such alternative embodiments are made in a similar manner as discussed previously with respect to FIGS. 7A–D. For example, another alternative embodiment of the inert piezoelectric layer of the present invention is illustrated in FIG. 10. As in FIG. 7B discussed previously, FIG. 10 shows a slab of piezoelectric material having a inert piezoelectric layer 1002 integral with the slab, grooves extending through the layer, and a bulk remainder portion 1003 of the slab. In contrast to FIG. 7B discussed previously, the grooves of FIG. 10 include grooves 1005 having the smoothed "V" profile. As shown, the grooves are etched into the slab so that the grooves have pitch, P, and width, W, and depth, D.

Figure 11:
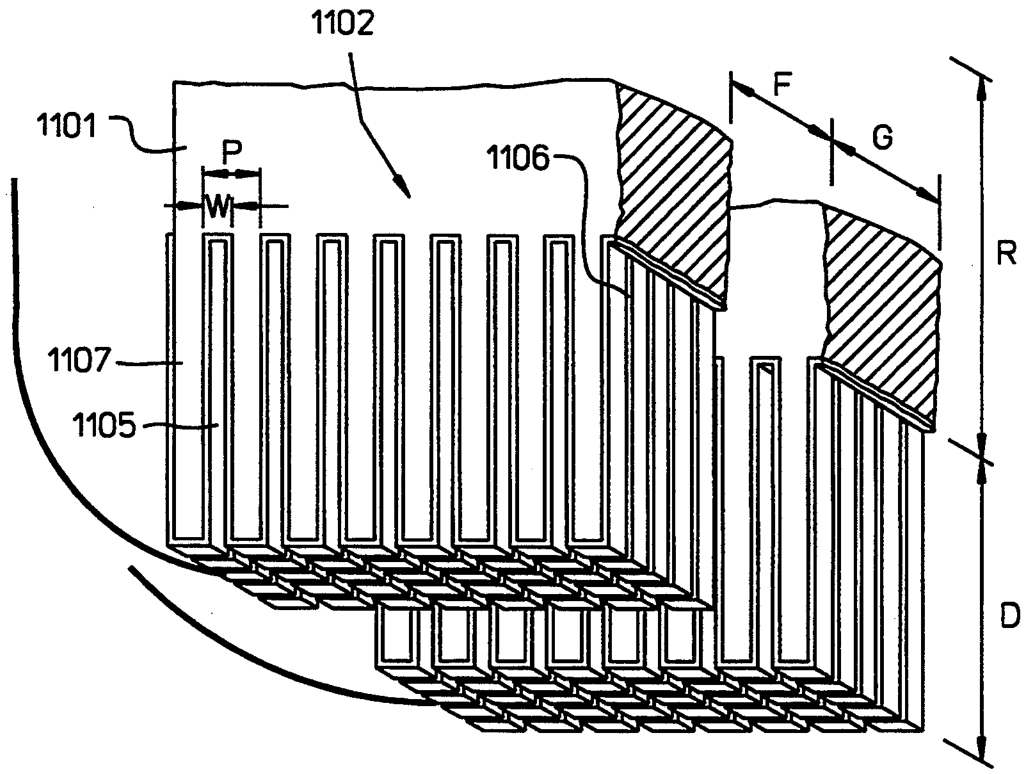
FIG. 11 is a detailed perspective view of yet another alternative embodiment of the invention.

Still other embodiments provide alternative arrangements of grooves on the respective rear surface of each piezoelectric element. For example, in contrast to the preferred embodiment shown in detail in FIG. 5A wherein the grooves disposed on each piezoelectric element are arranged substantially parallel to one another, yet another preferred embodiment is shown in detail in FIG. 11 wherein each piezoelectric element 1101 includes a respective inert piezoelectric layer 1102 having a first and second set of grooves, 1105, 1106 arranged substantially perpendicular to one another on the respective rear surface of each element. A metal film is sputtered onto the rear face of each element to provide a respective rear electrode 1107 extending into and contacting the grooves. Accordingly, the metal film blankets the grooves. Air is used as a conformal material disposed in the grooves. Because of the arrangement of the grooves shown in FIG. 11, the layer has 1–3 connectivity. As discussed previously, the grooves are cut into the piezoelectric elements using a dicing machine so as to have depth, D, width, W, and pitch, P. Alternatively, the grooves are selectively etched into elements using photolithography and chemical etchants, or are ablated using a laser.

Figure 12:
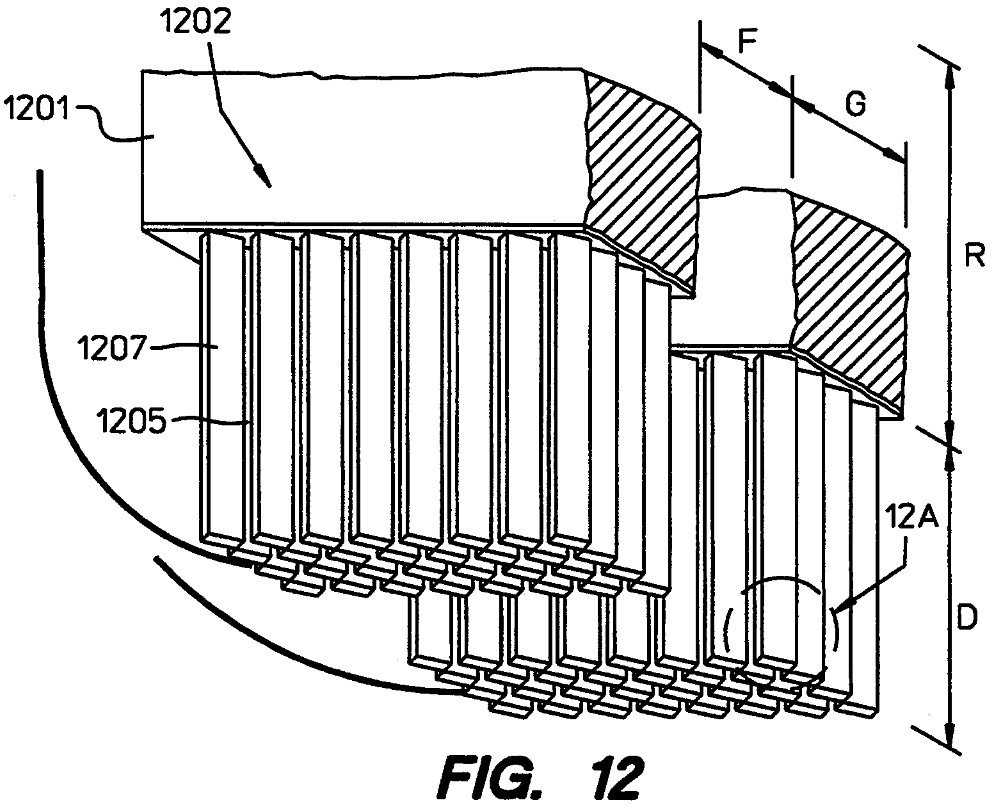
FIG. 12 is a detailed perspective view of yet another alternative embodiment of the invention.
Figure 12A:
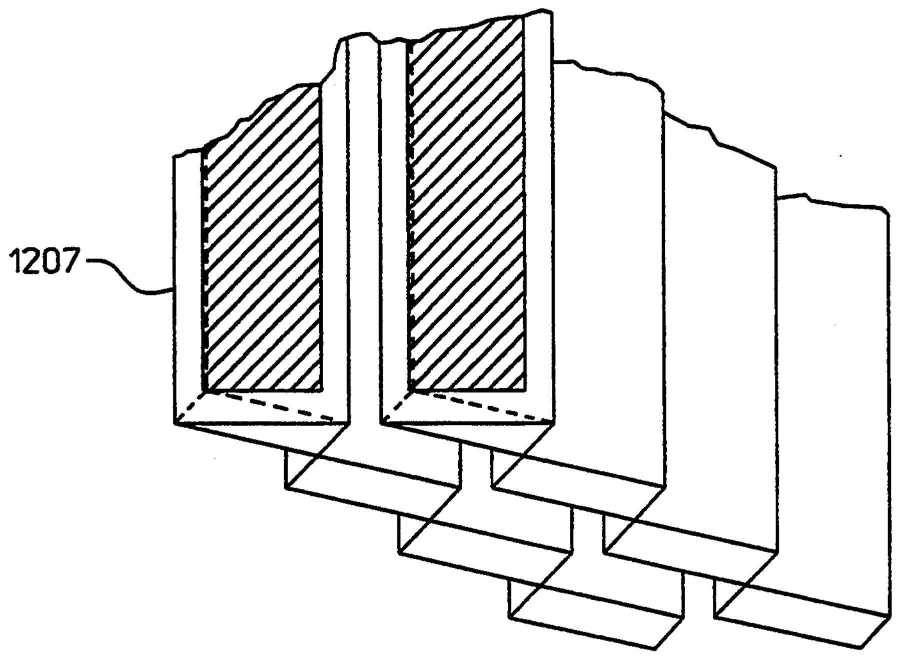
FIG. 12A is a further detailed cut away perspective view of a piezoelectric layer shown in FIG. 12.

Another alternative arrangement of grooves on the respective rear face of each piezoelectric element is shown in detail in FIG. 12 wherein each piezoelectric element 1201 includes a respective inert piezoelectric layer 1202 having specially contoured grooves 1205 etched into the layer. The specially contoured grooves provide lozenge shaped remainder ceramic portions of the piezoelectric layer. A respective rear electrode 1207 extending into and contacting the grooves is deposited as a metal film by sputtering. The metal film blankets the grooves of the layer. In a further detailed cut away view 12A the metal film of the electrode is cut away to show the weakly poled piezoelectric ceramic material of the inert piezoelectric layer. Air, used as conformal material disposed in the grooves. Because of the specially contoured grooves shown in FIG. 12 the piezoelectric layer has 1—1 connectivity.

Figure 13:
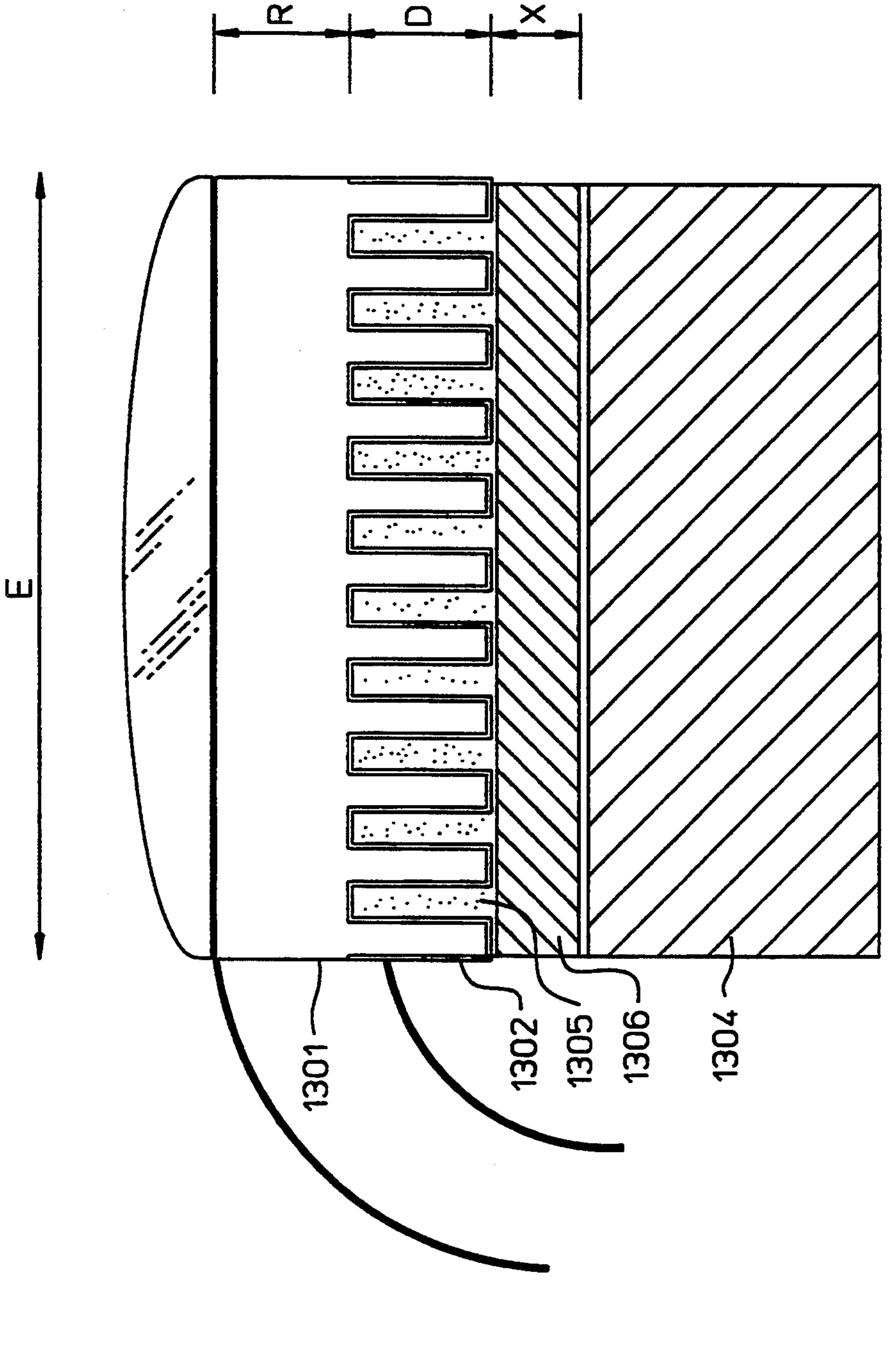
FIG. 13 is a simplified cross sectional view of yet another alternative embodiment of the invention.

A greatly simplified cross section view of yet another alternative embodiment of the present invention is shown in FIG. 13. As shown in FIG. 13, a piezoelectric element 1301 including an integral inert piezoelectric layer 1302 having grooves 1305 is substantially similar to that shown in FIG. 5. However, the alternative embodiment shown in FIG. 13 includes polyethylene as a conformal material disposed in the grooves, instead of air as discussed previously herein with respect to FIG. 5. Additionally, the alternative embodiment includes a second impedance matching layer 1306 bonded to the inert piezoelectric layer, the second layer having thickness, X, and an acoustic impedance selected to further improve an impedance match between the bulk acoustic impedance of the piezoelectric element 1301 and the acoustic impedance of an acoustically damping support body 1304.

Although specific embodiments of the invention have been described and illustrated, the invention is not to be limited to the specific forms or arrangements of parts so described and illustrated, and various modifications and changes can be made without departing from the scope and spirit of the invention. Within the scope of the appended claims, therefore, the invention may be practiced otherwise than as specifically described and illustrated.

What is claimed is:

1. An ultrasonic probe comprising:

an acoustically damping support body having an acoustic impedance;

a piezoelectric ceramic element having a bulk acoustic impedance, a rear face for acoustically coupling signals from the element to the support body, and a front face;

means integral with the piezoelectric ceramic element for substantially providing an acoustic impedance match between the bulk acoustic impedance of the piezoelectric ceramic element and the acoustic impedance of the support body, said means including grooves disposed on the rear face of the piezoelectric ceramic element; and a pair of electrodes, electrically coupled to the piezoelectric ceramic element, the pair of electrodes including a front electrode coupled to the front face of the piezoelectric element and a rear electrode extending into and contacting the grooves disposed on the rear face of the piezoelectric ceramic element.

2. An ultrasonic probe as in claim 1, further comprising:

an array of piezoelectric elements each having a bulk acoustic impedance, a respective rear face for acoustically coupling each element to the support body, and a respective front face;

a respective means integral with each piezoelectric element for substantially providing an acoustic impedance match between the bulk acoustic impedance of each piezoelectric element and the acoustic impedance of the support body, said respective means including grooves disposed on the respective rear face of each piezoelectric element; and a respective pair of electrodes, electrically coupled to each piezoelectric element, the respective pair of electrodes including a respective front electrode coupled to the respective front face of each piezoelectric element and a respective rear electrode extending into and contacting the grooves disposed on the respective rear face of each piezoelectric element.

3. A probe as in claim 2 wherein each element has a respective number of grooves disposed on each element within a range of approximately 50 to 200 grooves.

4. A probe as in claim 3 wherein the respective number of grooves disposed on each element is approximately 100 grooves.

5. An ultrasonic probe as in claim 1 wherein each of the grooves has a respective volume selected for substantially matching the acoustic impedance of the support body with the bulk acoustic impedance of the piezoelectric element.

6. An ultrasonic probe as in claim 1 wherein the grooves each have a respective depth dimension extending into the rear face, the respective depth dimension being approximately equal to one quarter of a wavelength of the acoustic signals.

7. An ultrasonic probe as in claim 1 wherein the grooves include a first and second set of grooves, each member of the first set of grooves having a respective depth dimension extending into the rear face that is approximately equal to a quarter of a first wavelength of the acoustic signals, each member of the second set of grooves having a respective depth dimension extending into the rear face that is approximately equal to a quarter of a second wavelength of the acoustic signals.

8. An ultrasonic probe as in claim 1 wherein:

the piezoelectric ceramic element comprises a layer of piezoelectric ceramic material contiguous with a bulk remainder portion of the piezoelectric ceramic material; and the grooves extend through the piezoelectric ceramic layer so as to provide a desired acoustic impedance of the layer.

9. An ultrasonic probe as in claim 8 wherein the grooves are arranged on the rear surface so that the piezoelectric layer has 2—2 acoustic connectivity.

10. An ultrasonic probe as in claim 8 wherein the grooves are arranged on the rear surface so that the piezoelectric layer has 1–3 acoustic connectivity.

11. An ultrasonic probe as in claim 8 wherein the grooves are arranged on the rear surface so that the piezoelectric layer has 1—1 acoustic connectivity.

12. An ultrasonic probe as in claim 1 wherein a dielectric constant measurable between the pair of electrodes is substantially the same as that which is intrinsic to a piezoelectric material of the element.

13. An ultrasonic probe as in claim 8 wherein layer comprises a weakly poled piezoelectric material

14. An ultrasonic probe as in claim 8 wherein an electrical potential along a thickness of the piezoelectric layer is small relative to an electric potential measurable between the pair of electrodes.

15. An ultrasonic probe as in claim 14 wherein the electrical potential along the thickness of the layer is less than approximately 5% of the electrical potential measurable between the pair of electrodes.

16. An ultrasonic probe as in claim 8 wherein the piezoelectric layer is substantially electromechanically inert.

* * * * *